Figure 1:
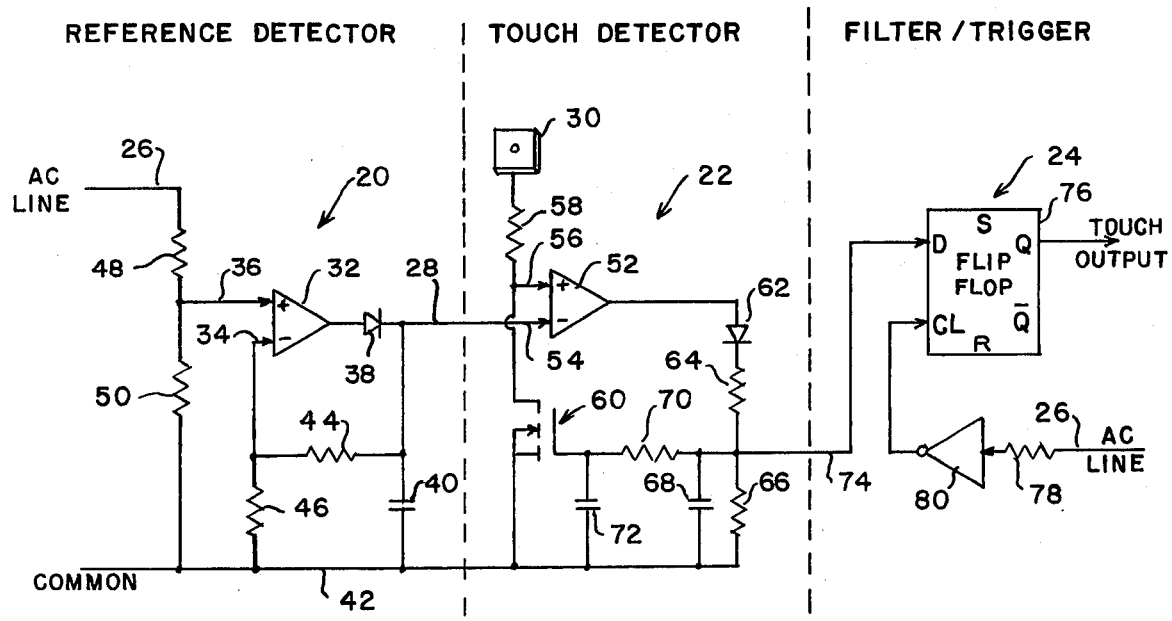

United States Patent [19]

Hamilton, II

[11] 4,081,700

[45] Mar. 28, 1978

[54] TOUCH CONTROL SWITCH CIRCUIT WITH COMPENSATION FOR POWER SUPPLY LINE FLUCTUATIONS

[76] Inventor: William F. Hamilton, II, 1512 Miramar Beach, Santa Barbara, Calif. 93108

[21] Appl. No.: 696,631

[22] Filed: Jun. 16, 1976

[51] Int. Cl.² .............................................. H03K 3/26
[52] U.S. Cl. ........................................ 307/308; 328/5; 307/251; 331/65; 340/258 C
[58] Field of Search ....................... 307/308, 116, 251; 328/5; 200/D 1; 340/258 C; 331/65

[56] References Cited

U.S. PATENT DOCUMENTS

| | | | |
|---|---|---|---|
| 3,764,819 | 10/1973 | Muller | 307/116 |
| 3,784,848 | 1/1974 | Hamilton | 307/308 |
| 3,919,596 | 11/1975 | Bellis | 307/308 |

*Primary Examiner*—Stanley D. Miller, Jr.
*Assistant Examiner*—B. P. Davis

*Attorney, Agent, or Firm*—Charles P. Boukus, Jr.

[57] ABSTRACT

A touch control switch circuit operable by a hum pickup signal induced in a human body by a power supply line incorporates a compensation arrangement to eliminate false operation of the circuit by fluctuations in the power supply signal. The circuit comprises a touch receptor operable by electrical contact with the human body to receive the induced hum pickup signal, a touch detector responsive to the hum pickup signal received by the touch receptor for producing an output signal in response to a change in amplitude of the hum pickup signal, and a compensation circuit responsive to the power supply signal for controlling operation of the touch detector to prevent a false output signal in response to fluctuations in the power supply signal. The compensation arrangement may be embodied as a reference detector which provides a variable reference signal for the touch detector to compensate for power line fluctuations or which disables the touch detector output upon the occurrence of power line fluctuations.

13 Claims, 4 Drawing Figures

TOUCH CONTROL SWITCH CIRCUIT WITH COMPENSATION FOR POWER SUPPLY LINE FLUCTUATIONS

The present invention relates to a touch control switch circuit with compensation for power supply line fluctuations and, more particularly, to a touch control switch circuit operable by a hum pickup signal induced in a human body by a power supply line including a compensation arrangement to prevent false actuation of the circuit in response to power supply line fluctuations.

In the field of touch control circuitry, touch detector circuits have been developed which respond to the hum pickup signals induced in a human body by an AC power supply line. Such detector circuits include a touch receptor operable by electrical contact with a human body. In the absence of a touch input, the receptor normally produces an oscillating signal in response to the ambient AC signal derived from the power supply line. When a touch input is applied, the oscillating signal produced by the receptor changes in amplitude to indicate the occurrence of a touch input. A detector responds to the change in amplitude of the oscillating signal to provide an output indicating the occurrence of a touch input.

Applicant's U.S. Pat. No. 3,784,848, entitled "Detector Circuit With Automatic Sensitivity Control And Post Detection Filtering For Touch Control Circuitry," discloses several examples of touch control detector circuits which respond to the induced hum pickup signal of a human body. As explained in U.S. Pat. No. 3,784,848, it is desirable to provide automatic sensitivity control and post detection filtering in such touch control detector circuits to enhance the reliability of the circuits with various input connector and touch receptor arrangements, e.g., long touch wires and multiple touch receptors, and to eliminate the effect of noise. These features permit touch control detector circuits employing automatic sensitivity control and post detection filtering to be successfully used with long touch wires and multiple touch receptors as a replacement for ordinary mechanical switch arrangements presently used in household and commercial installations.

There is a practical limit on the sensitivity of such detector circuits set by fluctuations in the supply signal usually encountered in the AC power wiring. High frequency noise in the power supply signal can be effectively suppressed by the post detection filtering disclosed in U.S. Pat. No. 3,784,848. However, fluctuations in the amplitude of the AC power supply signal can produce changes in the input signal sensed by the touch receptor and supplied to the detector which have characteristics identical to the signal changes produced in response to touch inputs. Further, amplitude fluctuations of several volts often appear when heavy loads are switched on and off. To prevent actuation of the touch detector circuits by such line voltage changes, the sensitivity of the detector must be set for minimum detectable voltage changes which are somewhat higher. Consequently, fluctuations on the power supply line present potential limitations on the practical application of touch control circuits.

The potential limitations occasioned by the supply line fluctuations are most significant in the case of touch control detector circuits employed with long touch wires, or other connector and receptor arrangements, wherein the input capacitance between the touch wires, touch receptors and ground is relatively large in comparison with the capacitance of the human body. When a touch input occurs, the body capacitance adds relatively little to the input capacitance of such circuits. Thus, in such an environment, an amplitude fluctuation on the power supply line as small as five percent can have a significant effect on the circuit operation because such voltage changes can be mistakenly interpreted as touch inputs. This situation is in distinct contrast to touch detector circuits with short touch wires and small touch receptors which exhibit relatively small input capacitance. With such touch detector circuits, the change in input capacitance upon the occurrence of touch inputs due to body capacitance is relatively large and the sensitivity of the touch detector circuits is relatively low. As a result, these detector circuits generally do not have a sensitivity high enough to make a small voltage fluctuation such as five percent a matter of concern.

The present invention is primarily intended to provide compensation for power supply line fluctuations in the operation of high sensitivity touch control detector circuits, e.g., those disclosed in U.S. Pat. No. 3,784,848, which make possible the use of long touch wires and other touch connector and receptor arrangements which exhibit relatively large input capacitance. In addition, the various embodiments of the invention are intended to obviate phase-sensitive cicuitry, since the phase of the touch signal can vary considerably in the environment of long touch wires.

Accordingly, a primary objective of the present invention is to provide a touch control switch circuit operable by the hum pickup signal induced in a human body from a power supply line which compensates for fluctuations in the power supply signal to void false outputs. In addition, an objective of the invention is to provide a touch detector circuit capable of enhanced sensitivity without the adverse effects of power line fluctuations.

In accordance with the present invention, a touch control switch circuit operable by a hum pickup signal derived from a power supply signal for detecting a touch input applied to the circuit comprises a touch receptor operable by electrical contact with the human body for producing an oscillating signal which changes in amplitude in response to a touch input applied to the receptor, detecting means responsive to the oscillating signal produced by the touch receptor for producing an output signal to indicate the change in amplitude of the oscillating signal, and sensing means responsive to the power supply signal for controlling the operation of the detecting means to prevent a false output signal in response to fluctuations in the power supply signal.

A preferred embodiment of the circuit incorporates a peak detector for producing a reference signal proportional to the amplitude of the power supply signal and a comparator for comparing the reference signal produced by the peak detector with the oscillating signal from the receptor to produce an output signal to indicate a change in the amplitude of the oscillating signal relative to the power supply signal. The comparator may be embodied as an operational amplifier having inputs for receiving the reference signal and oscillating signal. The reference signal adjusts the reference level of the operational amplifier in response to variations in the power supply signal to provide compensation for power supply fluctuations. Preferably, the circuit includes a trigger circuit, e.g., a flip-flop responsive to the output of the comparator and operable in synchronism with the power supply signal to produce an output signal upon the occurrence of a touch input.

An alternative embodiment of the touch control switch circuit includes a first peak detector for producing a reference signal proportional to the amplitude of the power supply signal, a second peak detector coupled to the touch receptor for producing an output signal proportional to the amplitude of the oscillating signal, and a comparator for comparing the reference signal produced by the first peak detector with the output signal of the second peak detector and producing an output signal to indicate a change in the oscillating signal relative to the power supply signal. The comparator may be embodied as an operational amplifier with its inputs coupled to the peak detectors. The first peak detector adjusts the reference level of the operational amplifier in response to variations in the power supply signal to provide compensation for power supply fluctuations. Preferably, the circuit includes a trigger circuit, e.g., a flip-flop, responsive to the output of the operational amplifier and operable in synchronism with the power supply signal to produce an output signal upon the occurrence of the touch input.

Another alternative embodiment of the touch control switch circuit comprises a touch receptor operable by contact with a human body for producing an oscillating signal which changes in amplitude in response to a touch input applied to the receptor, a touch detector responsive to the oscillating signal from the touch receptor for producing an output signal in response to a change in amplitude of the oscillating signal, a reference detector responsive to the power supply signal for producing an output signal upon the occurrence of a change in amplitude of the power supply signal, and a trigger circuit responsive to the output of the touch detector and to the reference signal produced by the reference detector and operable in synchronism with the power supply signal to provide an output signal to indicate the occurrence of a touch input applied to the touch receptor in the absence of a fluctuation in the power supply signal. The trigger circuit is effectively disabled during a fluctuation in the power supply signal to preclude an output indicative of a touch input to the receptor.

The accompanying drawings illustrate preferred embodiments of the invention and together with the description, serve to explain the principles of the invention.

Figure 2:
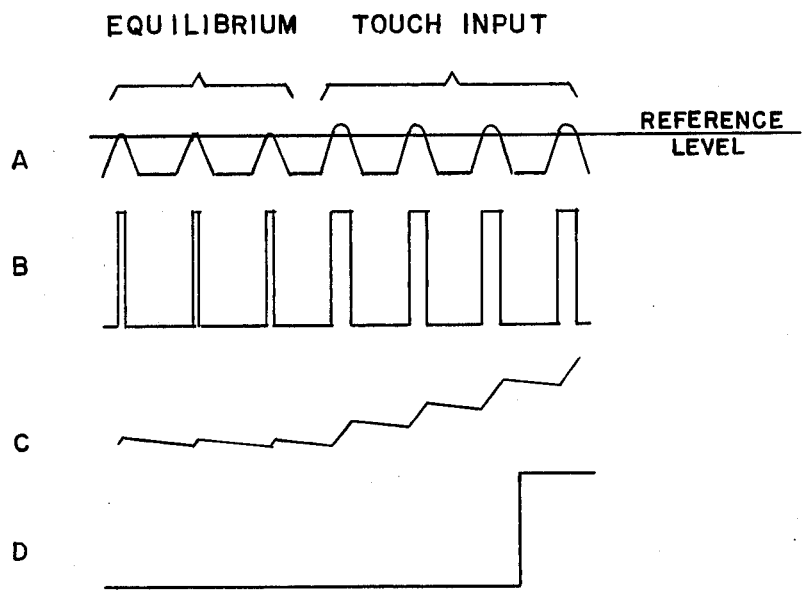
Figure 3:
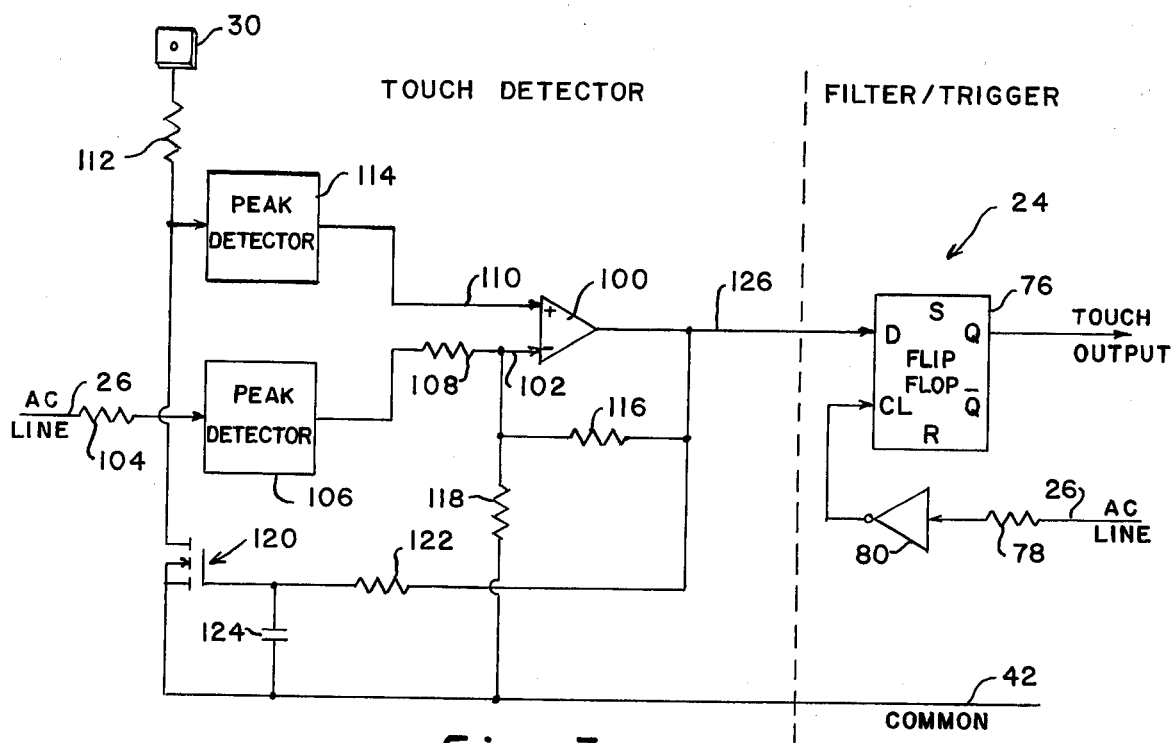
Figure 4:
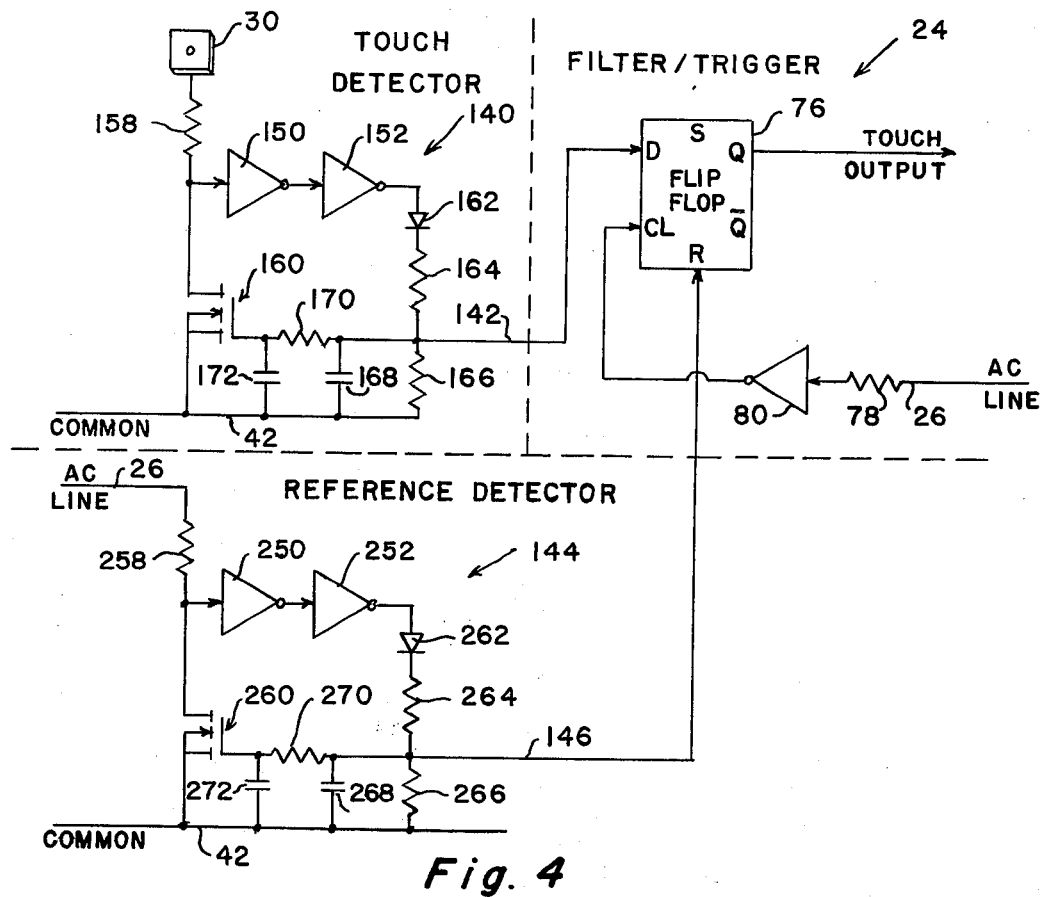

In the drawings:

FIG. 1 is a schematic diagram of a touch control switch circuit constructed in accordance with the principles of the present invention;

FIG. 2 contains a series of waveforms illustrating the operation of the touch control switch circuit of FIG. 1;

FIG. 3 is a circuit diagram of an alternative embodiment of the touch control switch circuit of the present invention; and FIG. 4 illustrates another alternative embodiment of the touch control switch circuit of the present invention.

Referring to FIG. 1, a preferred embodiment of the touch control switch circuit includes a reference detector, generally 20, a touch detector, generally 22, and a filter and trigger circuit, generally 24. Reference detector 20 comprises a peak detector responsive to a power supply signal, e.g., a conventional 60 Hz signal, on an AC power supply line 26 for producing a DC reference signal on a conductor 28 determined by the peak power supply signal. Touch detector 22 includes a touch receptor 30 operable by electrical contact with a human body. In the absence of a touch input, touch receptor 30 responds to the ambient signal from power supply line 26 to produce an oscillating signal of predetermined magnitude. When a touch input is applied, touch receptor 30 responds to the hum pickup signal induced in the human body by the power supply line to change, i.e., increase, the amplitude of its oscillating signal. The reference signal produced by reference detector 20 on conductor 28 provides compensation for fluctuations in the power supply signal to insure operation of touch detector 22 only in response to a touch input to the receptor. Filter and trigger circuit 24 produces an output pulse in response to a touch input with a sufficiently rapid rise time to trigger another device, e.g., a memory flip-flop (not shown). The filter and trigger circuit also eliminates adverse effects of any 60 Hz fluctuation at the output of touch detector 22.

Reference detector 20 comprises an operational amplifier 32 having an inverting input 34 and a non-inverting input 36. The output of operational amplifier 32 is applied via a diode 38 to a capacitor 40 connected to a common or ground line 42. A feedback voltage divider comprising resistances 44 and 46 provides feedback to inverting input 34 of operational amplifier 32. Non-inverting input 36 of the operational amplifier is coupled to a voltage divider comprising resistors 48 and 50 connected in series between AC power supply line 26 and common or ground line 42.

In equilibrium, the DC voltage at inverting input 34 of operational amplifier 32 is equal to the peak voltage appearing at non-inverting input 36. If the peak voltage at the non-inverting input increases, a large output voltage is momentarily produced by operational amplifier 32 to charge capacitor 40 through diode 38 until the voltage at inverting input 34 rises to the same level as the peak voltage at the non-inverting input. Thus, the output voltage across capacitor 40 is proportional to the peak input voltage to the operational amplifier and is also proportional to the AC line voltage.

The output voltage across capacitor 40 is applied via conductor 28 to provide a reference signal for touch detector 22. The touch detector includes a high gain operational amplifier 52 having an inverting input 54 coupled to conductor 28 and a non-inverting input 56 coupled through a large series resistance 58 to touch receptor 30. The non-inverting input of operational amplifier 52 is also shunted by a field effect transistor (FET) 60 controlled by feedback from the detector output. The output of operational amplifier 52 is connected via a diode 62 to a pair of series resistors 64 and 66 coupled to common or ground line 42. A capacitor 68 is connected across resistance 66. Diode 62, resistances 64 and 66, and capacitor 68 constitute a detector circuit having an output proportional to the average output voltage from operational amplifier 52. This average output voltage is applied to the gate of FET 60 via a low pass filter comprising a resistance 70 and capacitor 72.

The output of touch detector 22 is applied via a conductor 74 to the data input of a flip-flop 76 of the filter and trigger circuit. The clock input of flip-flop 76 is driven by the power supply signal on power supply line 26 through a resistor 78 and inverter 80.

Operation of the touch control switch circuit of FIG. 1 is illustrated by the waveforms of FIG. 2. In equilibrium, the peak voltage at non-inverting input 56 of operational amplifier 52 exceeds the reference voltage on conductor 28 by a slight amount (FIG. 2A). Since amplifier 52 has a high gain, its output switches from low to high during the brief time that the reference signal at its inverting input 54 is less than the oscillating signal applied to non-inverting input 56 from touch receptor 30. As a result, a series of narrow positive pulses (FIG. 2B) is produced at the output of amplifier 52 with a low duty cycle, i.e., a low average output voltage. During each positive pulse, current flows through diode 62 and resistance 64 to charge capacitor 68 (FIG. 2C). In the interval between pulses capacitor 68 discharges through resistance 66. The ratio of resistances 64 and 66 is selected such that, at the low duty cycle, the average voltage across capacitor 68 is approximately equal to the threshold voltage of FET 60. This threshold voltage is applied to the gate of FET 60 via the low pass filter, i.e., resistance 70 and capacitor 72, to hold the shunt resistance of the FET at a level to maintain the appropriate peak voltage at non-inverting input 56 of the amplifier 52 for the duty cycle.

When a touch input is applied to touch receptor 30, the amplitude of the voltage applied to non-inverting input 56 of amplifier 52 is increased (FIG. 2A) above the reference voltage at inverting input 54. As shown in FIG. 2B, the duty cycle of the amplifier output is abruptly increased. In addition, as shown in FIG. 2C, the output voltage across capacitor 68 increases to indicate the occurrence of the touch input. If the touch input continues for a sufficient time, feedback through the low pass filter comprising resistance 70 and capacitor 72 restores equilibrium at a lower level of FET shunt resistance. As a result, the sensitivity of amplifier 52 is automatically adjusted to allow the touch detector to respond to subsequent touch inputs. When the touch input is removed, the output pulses of amplifier 52 may be narrowed or terminated entirely until the voltage at the gate of FET 60 returns to its original level. Similarly, sensitivity is also adjusted automatically to appropriate levels for different arrangements of touch wires and touch receptors, or for different ambient conditions.

In addition, resistor 64 and capacitor 68 form a low pass filter to limit the rapidity in change of the detector output voltage. As indicated in FIG. 2C, the values of resistor 64 and capacitor 68 may be selected such that a touch input must persist for several cycles to substantially raise the detector output voltage. Thus, high frequency noise and transient noise are rejected from the detector output.

The sensitivity of the touch detector depends on the ratio of resistance 64 to resistance 66. Typically, this ratio is 1 to 10. A higher sensitivity can be achieved by decreasing the value of resistance 64 relative to resistance 66 to decrease the duty cycle of the amplifier output. Detector sensitivity increases as the duty cycle decreases because, as shown in FIG. 2A, the detector operates more and more along the horizontal portion of the AC line voltage peaks. The detector can be made to produce large output voltage excursions in response to changes of touch input voltage on the order of one percent. If the AC power supply line voltage increases by any amount, it raises the voltage at the touch receptor correspondingly. However, the touch detector output may fluctuate only slightly, because the reference signal at non-inverting input 54 of amplifier 52 is increased by an equal amount.

As shown in FIG. 2C, the touch detector output includes fluctuation at the 60 Hz rate. This fluctuation can be troublesome with certain kinds of trigger circuits following the touch detector, causing the trigger circuits to switch at the 60 Hz rate. The use of synchronously clocked flip-flop 76 as a filter and trigger circuit avoids this difficulty. The data input of flip-flop 76 responds to the touch detector via conductor 74 and its clock input is driven synchronously with the AC power supply line via inverter 80. Once each line cycle, the clock input switches from low to high. At this time only, the input signal present at its data input causes output Q of flip-flop 76 to become high or low depending on whether the input signal is above or below a flip-flop transition voltage (FIG. 2D). A high signal at output Q of flip-flop 76 indicates a touch input, while a low signal indicates the absence of a touch input.

As shown in FIG. 2A, touch inputs ordinarily increase the input signal to the touch detector. However, under some conditions, e.g., when the operator is grounded himself, a touch input may reduce rather than increase the input to the detector. This condition may be used to operate an appropriate trigger circuit (not shown) connected to the detector. The trigger circuit may, for example, be connected to the detector output at conductor 74, or to diode 62, or to the output of operational amplifier 52. Alternatively, the grounded condition of the operator may be used to operate the touch control switch circuit of FIG. 1 by connecting detector 20 so that its common line 42 is attached to the ungrounded or hot side of the AC power supply line while AC line 26 is connected to the grounded side of the power supply line. As a result, touch receptor 30 will be at a higher AC voltage than the operator. A touch input will cause an increase in current through series input resistance 58 and the operator to ground to raise the voltage across FET 60 at non-inverting input 56 of amplifier 52. No unsafe or even perceptible current will flow to the operator if input resistance 58 is made sufficiently large.

Referring to FIG. 3, an alternative embodiment of the touch control switch circuit includes an operational amplifier 100 having an inverting input 102 responsive to the power supply signal on power supply line 26 via a resistance 104, a first peak detector 106, and a resistance 108. Peak detector 106 is substantially identical to reference detector 20 of FIG. 1. In addition, operational amplifier 100 includes a non-inverting input 110 responsive to touch receptor 30 via a resistance 112 and a second peak detector 114. Peak detector 114 preferably employs the same circuit components of reference detector 20 of FIG. 1. Feedback from the output of operational amplifier 100 to its inverting input 102 is provided by a voltage divider comprising a pair of resistances 116 and 118. In addition, a FET 120 is connected in shunt between the input of peak detector 114 and common or ground line 42. The output of amplifier 100 is applied to the gate of FET 120 via a low pass filter comprising a resistor 122 and a capacitor 124. Filter and trigger circuit 24, which is identical to the corresponding filter and trigger circuit of FIG. 1, is connected via a conductor 126 to the detector output.

Peak detector 106 produces a DC reference signal proportional to the amplitude of the AC power supply signal which controls the reference level of the amplifier 100. In the absence of a touch input, receptor 30 responds to the ambient signal from the power supply line and peak detector 114 produces an output signal approximately equal to the DC reference signal. As a result, amplifier 100 produces a low output signal approximately equal to the threshold voltage of FET 120.

Upon the occurrence of a touch input to touch receptor 30, operational amplifier 100 produces an increased output signal determined by its gain, which is established by feedback resistors 116 and 118. The high output signal of amplifier 100 is used to drive output Q of flip-flop 76 high to indicate the occurrence of the touch input. Equilibrium is eventually established by feedback through the low pass filter comprising resistor 122 and capacitor 124 to raise the FET gate voltage and reduce its shunt resistance until the input to peak detector 114 returns to its original level. Thus, the sensitivity of the operational amplifier is automatically adjusted to enable the touch detector to respond to subsequent touch inputs. Fluctuations in power supply line voltage, which equally affect the input to peak detectors 106 and 114, result in no output from amplifier 100.

Referring to FIG. 4, another embodiment of the touch control switch circuit utilizes CMOS inverters rather than comparators or operational amplifiers. This embodiment is arranged to prevent touch detector outputs in periods of line voltage fluctuation rather than to adjust a reference signal to a comparator or operational amplifier as employed in the previous embodiments.

The touch control switch circuit includes a touch detector, generally 140, having its output applied via a conductor 142 to filter and trigger circuit 24 which is substantially identical to the corresponding filter and trigger circuit of FIG. 1. In addition, the circuit includes a reference detector, generally 144, responsive to the power supply signal on power supply line 26 with its output coupled by a conductor 146 to the reset terminal of flip-flop 76 of the filter and trigger circuit.

Touch detector 140 includes a pair of CMOS inverters 150 and 152 which respond to inputs to touch receptor 30 via a resistance 158. The remainder of the circuitry of touch detector 140 is substantially identical to touch detector 22 of FIG. 1. Referring to FIG. 4, touch detector 140 includes an average voltage detector circuit comprising a diode 162, a pair of series resistances 164 and 166, and a capacitor 168. In addition, the touch detector includes a low pass filter comprising a resistance 170 and a capacitance 172 in a feedback arrangement with a FET 160 connected in shunt between the input of inverter 150 and common or ground line 42. However, touch detector 140 differs from touch detector 22 in that it employs a fixed reference voltage, i.e., the threshold voltage of inverter 150. The output of inverter 152 switches from low to high whenever the input signal applied to inverter 150 exceeds a predetermined fraction of the DC supply voltage to the inverters.

Reference detector 144 is substantially similar in circuitry to touch detector 140. The reference detector incorporates a pair of CMOS inverters 250 and 252 coupled to AC power supply line 26 via a resistance 258, an average voltage detector network comprising a diode 262, a pair of series resistances 264 and 266, and a capacitor 268, and a feedback arrangement comprising a FET 260 and a low pass filter comprising a resistance 270 and a capacitance 272.

Reference detector 144 produces a high output only in response to power supply line voltage changes. On the other hand, touch detector 140 produces a high output either in response to a touch input or to a change in power supply line voltage. The output of reference detector 144 is applied via conductor 146 to the reset terminal of flip-flop 76 to prevent a high level signal at output Q of the flip-flop due to line voltage changes. A high signal can only appear when a touch input causes the output of touch detector 140 to rise in the absence of power line fluctuations. Preferably, the time constants of the detector circuits are arranged such that reference detector 144 responds more rapidly to line voltage fluctuations and operates for a longer period that touch detector 140 to preclude false touch outputs.

The touch control switch circuit illustrated in FIG. 3 provides an alternative embodiment of the invention in which a comparison of the amplitudes of the touch input and reference signals occurs after separate detection of each signal. The circuit of FIG. 3 requires an extra operational amplifier in addition to the two amplifirs employed in the circuit of FIG. 1.

The embodiment of FIG. 4 also performs separate detection of the touch input and reference signals prior to combination of the signals in the filter and trigger circuit. However, the detector circuits of FIG. 4 use inexpensive CMOS inverters in place of the operational amplifiers of FIGS. 1 and 3. The detector circuits with CMOS inverters (FIG. 4) function similarly to the touch detector of FIG. 1, but with a fixed reference level in contrast to the variable reference signal provided by the reference detector of FIG. 1.

In the touch control switch circuit of FIG. 4, the detector outputs could, if desired, be combined in an operational amplifier in a circuit arrangement similar to FIG. 3. However, this arrangement would require the two detectors to be accurately matched not only in overall gain but also in response time. To avoid the exact matching requirement, the detector outputs in FIG. 4 are combined in a digital device, e.g., the filter-trigger flip-flop, which is disabled upon the occurrence of a line voltage fluctuation. Alternatively, a logic gate circuit (not shown) could be used to suppress the touch detector output to the filter-trigger circuit when the reference detector indicates a transient on the power line. The above circuitry provides excellent performance except when a touch input arrives during a line transient. However, such transients are relatively rare unless extremely high sensitivity is sought.

The circuit of FIG. 4 may be arranged to respond to a decrease, rather than an increase, in the input signal to touch detector 140. In such a case, inverter 152 normally produces a stream of output pulses until the occurrence of a touch input when the output pulses stop. A suitable trigger circuit (not shown) may be coupled to the output of inverter 152 to sense the termination of the output pulses, rather than a circuit which responds to a voltage drop below the threshold voltage of FET 160.

In each of the embodiments of FIGS. 1, 3 and 4, the touch control switch circuits are arranged to avoid a direct comparison between the AC power supply signal supplied to the reference detector and the AC hum pickup signal applied to the touch receptor. This arrangement obviates the difficult and expensive requirement of accurate phase matching of the reference and touch signals. For example, in the circuit of FIG. 1, reference detector 20 provides a DC reference signal in response to fluctuations in the power supply signal for comparison with the hum pickup signal sensed by the touch receptor. The circuit of FIG. 2 employs peak detectors 106 and 114 responsive to the AC power supply signal and the hum pickup signal, respectively, which provide DC signals for comparison by operational amplifier 100. Finally, in the circuit of FIG. 4, touch detector 140 and reference detector 144 produce DC signals proportional to the average of the hum pickup and power supply signals, respectively, for operation of filter and trigger flip-flop 76. Thus, in all embodiments, the requirement of phase matching of the reference and touch signals is eliminated.

The above embodiments of the present invention achieve touch control switch circuits which compensate for fluctuations in the power supply signal and provide touch output signals only in response to touch inputs to the circuits. The invention allows touch control circuits of enhanced sensitivity to be achieved without false output signals as a result of power supply fluctuations.

The invention in its broader aspects is not limited to the specific details disclosed and described, and modifications may be made in the touch control switch circuits without departing from the principles of the invention.

What is claimed is:

1. In a touch control switch circuit operable by a hum pickup signal derived from a power supply signal for detecting a touch input applied to the circuit, a compensation circuit for preventing false indications of touch inputs in response to fluctuations in the power supply signal, comprising:
   a touch receptor operable by electrical contact with a human body for producing an oscillating signal which changes in amplitude in response to a touch input applied to said receptor;
   detecting means responsive to the oscillating signal produced by said touch receptor for producing an output signal to indicate the change in the amplitude of the oscillating signal; and
   sensing means responsive to fluctuations in the power supply signal for applying a compensation signal to said detecting means to prevent a false output signal in response to any fluctuations in the power supply signal.

2. The touch control switch circuit of claim 1, wherein:
   said sensing means comprises a peak detector for producing a reference signal proportional to the amplitude of the power supply signal; and
   said detecting means incudes a comparator for comparing the reference signal produced by said peak detector with the oscillating signal from said receptor to produce an output signal to indicate a change in the amplitude of the oscillating signal relative to the power supply signal.

3. The touch control switch circuit of claim 2, which includes:
   a trigger circuit responsive to the output of said comparator and operable in synchronism with the power supply signal to produce an output signal to indicate the occurrence of a touch input.

4. The touch control switch circuit of claim 2, wherein:
   said comparator comprises an operational amplifier having a non-inverting input coupled to said touch receptor and an inverting input responsive to the reference signal and a feedback path responsive to the output of said operational amplifier and coupled to said non-inverting input for controlling the sensitivity of said comparator to the oscillating signal from said touch receptor.

5. The touch control switch circuit of claim 4, which includes:
   a flip-flop having a data input coupled to the output of said operational amplifier and a clock input operable by the power supply signal for producing an output signal to indicate the ocurrrence of a touch input.

6. The touch control switch circuit of claim 2, wherein:
   said sensing means comprises a first peak detector for producing a reference signal proportional to the peak power supply signal; and
   said detecting means comprises a second peak detector coupled to said touch receptor for producing an output signal proportional to the amplitude of the oscillating signal and a comparator for comparing the reference signal produced by said first peak detector with the output signal of said second peak detector and producing an output signal to indicate a change in the oscillating signal relative to the power supply signal.

7. The touch control switch circuit of claim 6, which includes:
   a trigger circuit responsive to the output of said comparator and operable in synchronism with the power supply signal to produce an output signal to indicate the occurrence of a touch input.

8. The touch control switch circuit of claim 6, wherein:
   said comparator comprises an operational amplifier having an inverting input coupled to the output of said first peak detector and a non-inverting input coupled to the output of said second peak detector and a feedback path responsive to the output of said operational amplifier and coupled to said non-inverting input for controlling the sensitivity of said comparator to the oscillating signal from said touch receptor.

9. The touch control switch circuit of claim 8, which includes:
   a flip-flop having a data input coupled to the output of said operational amplifier and a clock input operable by the power supply signal for producing an output signal to indicate the occurrence of a touch input.

10. In a touch control switch circuit operable by a hum pickup signal derived from a power supply signal for detecting a touch input applied to the circuit, a compensation circuit for preventing false indications of touch inputs in response to fluctuations in the power supply signal, comprising:
    a touch receptor operable by electrical contact with a human body for producing an oscillating signal which changes in amplitude in response to a touch input applied to said receptor;
    a touch detector responsive to the oscillating signal from said touch receptor for producing an output signal in response to a change in amplitude of the oscillating signal;
    a reference detector responsive to fluctuations in the power supply signal for producing a reference signal upon the occurrence of a change in amplitude of the power supply signal; and
    a trigger circuit responsive to the output signal of said touch detector and to the reference signal produced by said reference detector to provide an output signal to indicate the occurrence of a touch input applied to said touch receptor in response to said detector output signal, said trigger circuit being disabled by the reference signal during a fluctuation in the power supply signal to preclude a false trigger output signal indicative of a touch input.

11. The touch control switch circuit of claim 10, wherein said trigger circuit comprises:
a flip-flop having a data input coupled to the output of said touch detector, a reset terminal responsive to the reference signal produced by said reference detector and a clock input operable in synchronism with the power supply signal.

12. The touch control switch circuit of claim 10, wherein:
said touch detector comprises a pair of CMOS inverters connected to said touch receptor, a first average detector responsive to the output of said pair of CMOS inverters, and a feedback path responsive to the output of said touch detector for controlling the sensitivity of said touch detector to changes in the oscillating signal; and
said reference detector comprises a pair of CMOS inverters responsive to the power supply signal, a second average detector responsive to the ouput of said pair of CMOS inverters, and a feedback path responsive to the output of said second peak detector for controlling the sensitivity of said touch detector to changes in the power supply signal.

13. The touch control switch circuit of claim 10, wherein said trigger circuit is operable in synchronism with the power supply signal.

* * * * *